United States Patent [19]

Jackson

[11] 4,054,469
[45] Oct. 18, 1977

[54] DIRECTIONALLY SOLIDIFIED EUTECTIC $\gamma+\beta$ NICKEL-BASE SUPERALLOYS

[75] Inventor: Melvin R. Jackson, Schenectady, N.Y.

[73] Assignee: General Electric Company, Schenectady, N.Y.

[21] Appl. No.: 691,935

[22] Filed: June 1, 1976

[51] Int. Cl.² .................... C22C 30/00; C22C 19/05
[52] U.S. Cl. ........................................ 148/31; 75/122; 75/134 F; 75/170; 75/171; 148/32; 148/32.5
[58] Field of Search ............ 75/171, 170, 122, 134 F; 148/32, 32.5, 31

[56] References Cited

U.S. PATENT DOCUMENTS 3,671,223    6/1972    Thompson et al. .................... 148/32

*Primary Examiner*—R. Dean
*Attorney, Agent, or Firm*—F. Wesley Turner; Joseph T. Cohen; Jerome C. Squillaro

[57] ABSTRACT

A directionally solidified multivariant eutectic $\gamma+\beta$ nickel-base superalloy casting having improved high temperature strength and oxidation resistance properties is provided comprising a two phase eutectic structure containing, on a weight percent basis, 7.0–12.0 aluminum, 5.0–40.0 chromium, 3.0–35.0 iron and the balance being nickel. Embedded within the $\gamma$ phase nickel-base matrix are aligned eutectic $\beta$ phase (primarily (Ni,Fe,Al) )reinforcing lamellae.

11 Claims, 3 Drawing Figures

DIRECTIONALLY SOLIDIFIED EUTECTIC γ+β NICKEL-BASE SUPERALLOYS

BACKGROUND OF THE INVENTION

1. Field of the Invention

The present invention relates to directionally solidified multivarient eutectic γ+β nickel-base superalloy articles and compositions, and more particularly to eutectic articles and compositions which include a γ phase nickel-base superalloy matrix reinforced with aligned β phase lamellae, primarily nickel- iron -aluminum lamellae wherein the γ phase is a face-centered-cubic solid solution based on nickel and the β phase is body-centered-cubic (CsCl) ordered intermetallic based on (Ni,Fe)Al.

2. Description of the Prior Art

The development of directionally solidifying nickel-base superalloys in the gas turbine engine alloy art has reached the point where current advances are based on identifying eutectic nickel-base superalloy compositions since such compositions permit (a) orientation of eutectic phases and (b) inclusion of eutectic phase reinforcing members such as lamellae.

In directionally solidified eutectic alloy composites, the highly desirable strength properties at high temperatures, i.e. greater than 950° C. (1,742° F.) are provided by metallic composite containing aligned lamellae fibers as a reinforcing phase dispersed in the alloy matrix. In order to improve the high temperature stress rupture and oxidation properties, it is desirable to identify the alloys, especially oxidation resistant eutectic alloys which can be directionally solidified to provide fiber or platelet reinforced superalloy matrix. Although strong oxidation resistant superalloys involving nickel, aluminum, chromium and iron alone or with other alloying additions are known, heretofore the identification of oxidation resistant high strength eutectic alloys that can be directionally solidified which contain nickel, aluminum, chromium and iron have not been defined.

DESCRIPTION OF THE INVENTION

In accordance with the present invention, I have discovered a unidirectionally solidified multivariant eutectic γ+β nickel-base superalloy casting having improved high temperature strength and oxidation resistance properties comprising a two phase eutectic structure consisting of a matrix of a nickel-base superalloy — having an aligned reinforcing lamellar β phase consisting primarily of nickel-iron-aluminum (Ni,Fe,Al) embedded in a γ phase matrix — containing, on a weight percent basis, 7.0 to 12.0 aluminum, 5.0 to 40.0 chromium, 3.0 to 35.0 iron, and the balance being essentially nickel. A presently preferred superalloy contains, on a weight percent basis, 8.0 to 11.5 aluminum, 18.0 to 28.0 chromium, 5.0 to 15.0 iron, and the balance being essentially nickel. Since the γ and β phases are in equilibrium, all elements in the alloy are substantially present in both phases. The aforesaid castings contain a substantial volume fraction of a reinforcing β(Ni,Fe)Al phase which imparts substantial high temperature stress rupture strength to the castings.

In order to obtain the nickel-base superalloys of my invention, my alloys must be unidirectionally solidified to enable (Ni,Fe)Al-rich β eutectic lamellae to be formed simultaneously with and be bonded to the reinforced solid solution matrix. The unidirectional solidification can be conducted by one or more of the many methods and using apparatus well-known and widely reported in the art as described by C.T. Sims et al., *The Superalloys*, Wiley & Sons (1972).

The maximum directional solidification rate of my γ−β lamellar eutectics is a function of alloy composition for a fixed thermal gradient. In general, the solidification temperature gradient normally falls within the range of from about 60° C. to about 150° C. per centimeter, and the directional solidification rate falls within the range of from about ¼ in./hr. (0.64 cm./hr.) to about 4 in./hr. (10 cm./hr.) at 80° C. per centimeter of thermal gradient. Since the directional solidification rate and the resultant morphology of my alloys is effected by the composition of my alloys, the expression directional solidification (ds) rate is defined herein and in the appended claims as any rate at which my eutectic alloys may be solidified without formation of undesirable cell or dendrite structures.

The resistance of the γ+β eutectic structures of my invention to cyclic oxidation exposure (one hour cycles) between 1,100° C. and 200° C. is excellent, as observed by weight change measurements and metallography. In general, after 1,000 cycles, there is nominal weight change in the alloys. Metallography of the alloys after cyclic oxidation shows an adherent protective oxide outer layer adjacent to a β-denuded surface layer of the substrate, with the majority of the substrate being unaltered.

My invention is more clearly understood from the following description taken in conjunction with the accompanying figures described hereafter:

Several quaternary Ni-Al-Cr-Fe alloys have been melted and directionally solidified at 25 mm./hr. in order to define the range of the eutectic composition. Thermal arrests (solidification temperatures also commonly referred to as melting points) for each alloy are listed in Table I which follows:

TABLE I

Eutectic γ-β Nickel-Base Superalloys

| Example | Alloy Composition wt.% | | | | Thermal Arrest (° C.) |
|---|---|---|---|---|---|
| | Ni | Al | Cr | Fe | |
| 1 | 51.7 | 9.4 | — | 38.9 | 1371 |
| 2 | 61.7 | 10.3 | — | 28.0 | 1385 |
| 3 | 71.8 | 11.2 | — | 17.0 | 1370 |
| 4 | 56.1 | 9.3 | 9.9 | 24.7 | 1345 |
| 5 | 70.7 | 8.8 | 14.9 | 5.6 | 1338 |
| 6 | 55.1 | 8.6 | 20.1 | 16.2 | 1325 |
| 7 | 60.2 | 8.9 | 20.1 | 10.8 | 1308 |
| 8 | 66.9 | 7.7 | 19.8 | 5.6 | 1316 |
| 9 | 52.0 | 7.3 | 35.0 | 5.7 | 1285 |
| 10 | 56.9 | 7.8 | 35.3 | — | 1290 |

As illustrated by the data for a constant Cr level, there is essentially no change in eutectic temperature with variation in the Fe content. The aligned eutectic γ−β structure compositions are essentially those given in the table since primary crystals of either γ or β are absent. Additions of either Fe or Cr reduce the Al content for composite alightment. A 10 atomic percent (a/o) addition of Fe or Cr results in 1.5 a/o less Al in the eutectic alloy. Wide variations in the eutectic compositions do not significantly effect the solidification temperature range, since well-aligned structure can be produced at 25 mm./hr. with large changes in the eutectic alloy composition.

Because of the decrease in Al with increase in Cr or Fe, densities for the alloys change very little. The range measured for the alloys above is 7.2–7.6 g./cc., with most of the alloys at 7.4 g./cc. Densities are 85–90% of densities of conventional superalloys.

Cyclic oxidation exposures were carried out on the eutectic $\gamma-\beta$ nickel-base superalloys of Examples 1–7 of Table 1. The cyclic oxidation consisted of one hour cycles of the eutectic alloy between 200° C. and 1,100° C. with fifty minutes of each cycle at 100° C. Weight change measurements were used to follow the oxidation weight gain and the oxide spallation weight loss of the alloys. Metallographic examination after cyclic oxidation indicated an adherent oxide layer was formed and a slight loss of Al from the alloy occurred to allow the formation of the highly protective alumina layer. Hot corrosion resistance of the quaternary alloys, Ni-Al-Cr-Fe, also is expected to be extremely good, provided the alloy composition is balanced to maintain high levels of Cr and Al with appropriate reduction in Fe.

Figure 1:
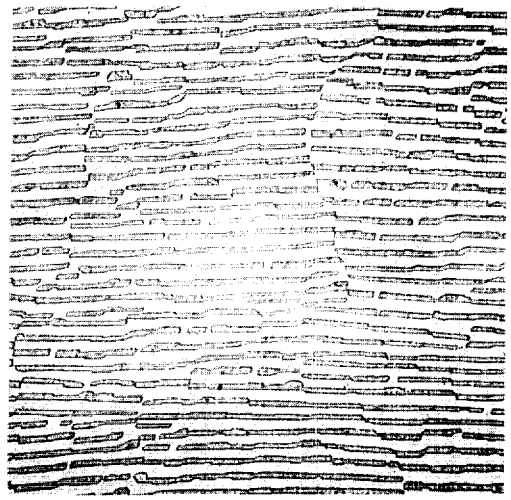
FIG. 1 is a photomicrograph of a transverse section of a nickel-base alloy of my invention containing 54.6 Ni, 8.6 Al, 19.9 Cr and 16.9 Fe, on a weight percent basis, directionally solidified at 25 mm./hr. The minor lamellar phase is (Ni,Fe)Al-rich β eutectic lamellae having a spacing of 5 to 6.5 μm.
Figure 2:
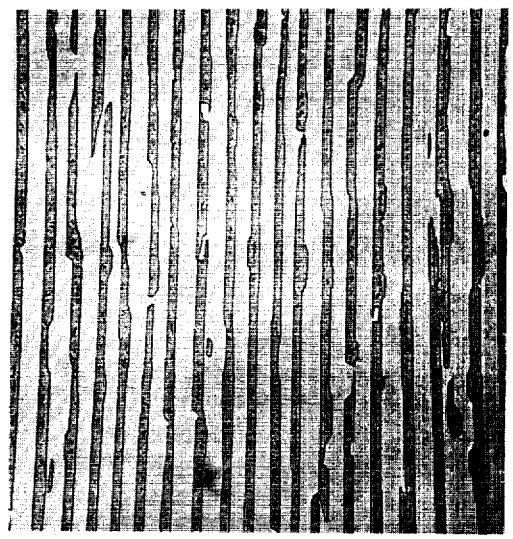
FIG. 2 is a photomicrograph of a longitudinal sectional of the alloy of composition of FIG. 1.
Figure 3:
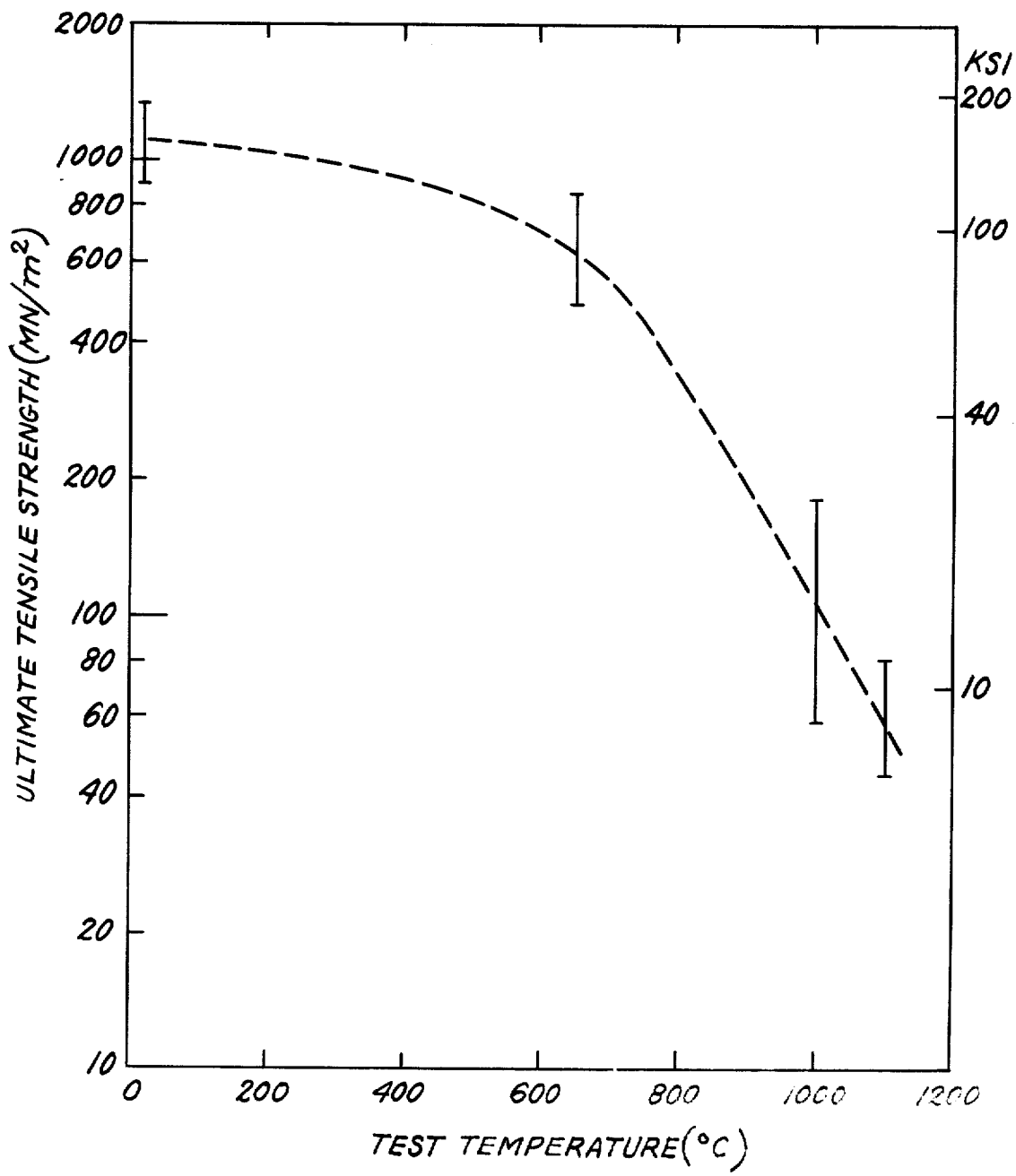

The $\gamma-\beta$ alloys of Examples 4–9 were tested in tension to determine their room temperature and elevated temperature strengths. The range of ultimate tensile strengths measured for the alloys as a function of test temperature is shown in FIG. 3. In the range of temperatures important in gas turbine materials, the $\gamma-\beta$ eutectic alloys of my invention are comparable to present-day conventional nickel-base superalloys. Since $\gamma-\beta$ eutectic densities are much lower than densities of current superalloys, the eutectics present further strength advantage for rotating hot-section gas turbine components.

Fe added to NiAlCr destabilizes $\gamma'$ formation in favor of stable $\gamma-\beta$ eutectic structures. Additions of Co have the same effect. Accordingly, in the practice of my invention, the Fe content of my eutectics can be partially or completely replaced by additions of Co on a weight percent basis up to a total of about 35% Co. Illustratively an alloy, on a weight percent basis, of 54.6 Ni, 19.9 Cr, 17.0 Co and 8.5 Al is Al-poor, however chemical segregation in the directional solidification (20 mm./hr.) of the alloy resulted in the top half of an ingot being aligned $\gamma-\beta$ eutectic.

Other elements can be added to the Ni-Al-Cr-Fe(Co) $\gamma-\beta$ eutectics of my invention to produce solid solution hardening of the matrix. The elements are commonly used in conventional Ni-base superalloy metallurgy. Accordingly molybdenum and tungsten, can be added to $\gamma+\beta$ eutectics, on a weight basis, in amounts of from 0.0 to 4.0 Mo and/or 0.0 to 1.5W, added singly or in combination to the $\gamma-\beta$ eutectic alloys. Additions of these elements can be made replacing Ni, Cr, or Fe, but not Al.

It will be apparent to those skilled in the art that other changes and modifications within the full intended scope of the invention as defined by the appended claims can be made in the particular embodiments of the invention described herein.

I claim:

1. An article of manufacture having improved high temperature strength and oxidation resistance properties comprising a directionally solidified multivariant eutectic $\gamma+\beta$ nickel-base superalloy casting containing a two phase eutectic structure consisting of a $\gamma$ phase matrix of a face-centered-cubic solid solution crystal structure based on nickel having embedded in the $\gamma$ phase an aligned reinforcing lamellar $\beta$ phase consisting primarily of a nickel-iron-aluminum (Ni,Fe,Al) composition which is a body-centered-cubic (CsCl) ordered intermetallic based on (Ni,Fe)Al.

2. The claim 1 article wherein said casting consists essentially of, on a weight percent basis, 7.0–12.0 aluminum, 5.0–40.0 chromium, 3.0–35.0 iron and the balance being nickel.

3. The claim 2 article containing 8.0–11.5 aluminum, 18.0–28.0 chromium, 5.0–15.0 iron and the balance being essentially nickel.

4. The claim 2 article containing, on a weight percent basis, 0.0–0.01 boron.

5. The claim 2 article containing, on a weight percent basis, 0.0–0.1 zirconium.

6. The claim 2 article, containing, on a weight percent basis, 0.0–4.0 molybdenum.

7. The claim 2 article containing, on a weight percent basis, 0.0–10.5 tungsten.

8. The claim 2 article containing, on a weight percent basis, 0.0–35.0 cobalt as a replacement for iron on an atomic ratio basis of about 1:1.

9. The claim 2 article consisting essentially of, on a weight percent basis, 8.6 aluminum, 20.1 chromium, 16.2 iron and the balance essentially nickel.

10. The claim 2 article consisting essentially of, on a weight percent basis, 8.9 aluminum, 20.1 chromium, 10.8 iron and the balance essentially nickel.

11. The claim 8 article, consisting essentially of, on a weight percent basis, 8.5 aluminum, 19.9 chromium, 17.0 cobalt and the balance essentially nickel.

* * * * *